United States Patent [19]
Iino et al.

[11] Patent Number: 5,968,266
[45] Date of Patent: Oct. 19, 1999

[54] APPARATUS FOR MANUFACTURING SINGLE CRYSTAL OF SILICON

[75] Inventors: Eiichi Iino; Masanori Kimura; Shozo Muraoka, all of Annaka, Japan

[73] Assignee: Shin-Etsu Handotai Co., Ltd., Tokyo, Japan

[21] Appl. No.: 08/822,088

[22] Filed: Mar. 20, 1997

[30] Foreign Application Priority Data

Mar. 27, 1996 [JP] Japan .................................. 8-097704

[51] Int. Cl.⁶ .................................................. C30B 35/00
[52] U.S. Cl. ........................... 117/217; 117/30; 117/32; 117/222; 117/917
[58] Field of Search ........................... 117/30, 32, 200, 117/217, 222, 917

[56] References Cited

U.S. PATENT DOCUMENTS

| | | | |
|---|---|---|---|
| 3,039,071 | 6/1962 | Ford | 338/294 |
| 4,597,949 | 7/1986 | Jasinski et al. | 117/917 |
| 5,330,729 | 7/1994 | Oda et al. | 117/217 |
| 5,766,346 | 6/1998 | Hayashi et al. | 117/200 |
| 5,766,347 | 6/1998 | Shimomura et al. | 117/217 |
| 5,843,228 | 12/1998 | Saitoh et al. | 117/201 |

FOREIGN PATENT DOCUMENTS

| | | |
|---|---|---|
| 0499471 | 8/1992 | European Pat. Off. . |
| 61-044794 | 3/1986 | Japan . |
| 2136310 | 9/1984 | United Kingdom . |

*Primary Examiner*—Felisa Hiteshew
*Attorney, Agent, or Firm*—Oliff & Berridge, PLC

[57] ABSTRACT

An apparatus for manufacturing a single crystal of silicon includes a crucible, a heater, electrodes, and a magnet. In addition to a plurality of heat generating portions and two main electrode portions, the heater has two or more auxiliary electrode portions. Two or more heater support members having an insulating property are further provided so as to support the heater through the auxiliary electrode portions. The number of heat generating portions which may be present between a heater support member and an electrode and between heater support members if adjacent to each other is equal to or less than 4. Each generating portion of the heater has a thickness of 25 mm or more. This structure makes it possible to produce a single crystal of silicon without causing breakage of a heater, even if a large electric current flows through the heater, even if a magnetic field of a high intensity is applied to a silicon melt in the crucible, and even if the heater has a large diameter.

5 Claims, 5 Drawing Sheets

APPARATUS FOR MANUFACTURING SINGLE CRYSTAL OF SILICON

BACKGROUND OF THE INVENTION

1. Field of the Invention:

The present invention relates to an apparatus for manufacturing a single crystal of silicon under application of a magnetic field. Particularly, the invention relates to an apparatus suitable for manufacturing a single crystal of silicon having a large diameter of 8 inches or more.

2. Description of the Related Art:

Single crystals of silicon used as a material for semiconductor device substrates are manufactured mainly by the Czochralski method (hereinafter referred to simply as the CZ method). Recently there has also been known a so-called MCZ method (magnetic field applied CZ method) as an improvement over the CZ method. According to the MCZ method, a single crystal of silicon is manufactured while a magnetic field is applied to silicon melt contained in a crucible in order to suppress natural convection of the silicon melt induced by heating of the melt.

Recently, single crystals of silicon as large as 8 inches or more in diameter have been demanded. In manufacturing silicon single crystals of such a large diameter, a large crucible is used, which is filled with a large amount of silicon melt. For example, 100 kg or more of silicon material is charged into the crucible to be melted therein, and a single crystal of silicon is then pulled. However, when such a large amount of a silicon melt is used, natural convection induced by heating becomes vigorous, causing the silicon melt to become more and more unstable and making it difficult to grow a single crystal of silicon. Adopting the MCZ method, which can suppress such natural convection of the silicon melt, is an effective way to avoid this difficulty.

In a silicon single crystal manufacturing apparatus used in the CZ method or the MCZ method, there usually is provided a cylindrical heater surrounding the outer periphery of a crucible for heating silicon melt contained in the crucible. This cylindrical heater is formed with alternating grooves extending downward from the upper e nd and grooves extending upward from the lower end. An electric current flows vertically through each segment defined by adjacent grooves.

In a silicon single crystal manufacturing apparatus used in the MCZ method there also is provided a magnet which usually applies a horizontal magnetic field to silicon melt contained in the crucible.

Consequently, in the silicon single crystal manufacturing apparatus used in the MCZ method, a force is exerted on each segment of the heater from interaction of the electric current flowing vertically through the segment and the horizontal magnetic field applied to the silicon melt. However, since the direction of that force varies depending on the direction of the electric current flowing through the segment, great distortion and breakage of the heater may result.

Particularly, for manufacturing silicon single crystals of such a large diameter as 8 inches or more, especially 10 to 16 inches which have recently been demanded, it is necessary to use a crucible of a large diameter as mentioned above and further necessary to use a heater which is also of a large diameter to match the crucible.

Into the crucible of a large diameter is then charged a large amount of silicon melt. For maintaining such a large amount of silicon melt at a constant temperature during growth of a single crystal of silicon, it is necessary to increase the calorific value of the heater. Consequently, the working electric power increases, resulting in an increase of the electric current flowing through the heater.

On the other hand, for suppressing the vigorous natural convection of such large amounts of silicon melt occurring within crucibles of such a large diameter, it is necessary to apply a magnetic field of a high intensity to the silicon melt.

For the growth of a silicon single crystal with a diameter as large as 8 inches or more it is necessary to supply a large electric current and a high intensity magnetic field, making the heater distortion more conspicuous and increasing the likelihood that distortion will cause breakage of the heater.

Further, the heater used in the manufacture of a silicon single crystal as large as 8 inches or more in diameter is itself very heavy causing distortion of the heater due to its own weight to also pose a problem.

Under these circumstances, development of an apparatus capable of manufacturing a single crystal of silicon without causing breakage of the heater used, even if a large electric current flows through the heater, even if a magnetic field of a high intensity is applied to the silicon melt in the crucible, and even if the heater is of a larger diameter, has been desired.

SUMMARY OF THE INVENTION

An object of the present invention is to provide an improved apparatus for manufacturing a single crystal of silicon which can manufacture a single crystal of silicon without causing breakage of a heater used, even if a large electric current flows through the heater, even if a magnetic field of a high intensity is applied to silicon melt in the crucible, and even if the heater has a larger diameter.

Through extensive study, the inventors of the present invention found that the adoption of some combination of the following features 1)–3) in an apparatus for manufacturing a single crystal of silicon makes it possible to suppress the distortion induced from interaction of an electric current flowing through each segment of a heater and a horizontal magnetic field applied to silicon melt and to suppress the distortion attributable to the heater's own weight so that a single crystal of silicon can be produced without breakage of the heater, even with a large electric current flowing through the heater, even with a magnetic field of a high intensity applied to the silicon melt, and even with the heater being large in diameter.

1) The heater used in the conventional apparatus has two electrode portions (portions indicated at 32 in FIG. 5A and FIG. 5B and is supported by electrodes through the two electrode portions. In the present invention, the heater used has two or more auxiliary electrode portions in addition to the two electrode portions (main electrode portions) as in the conventional apparatus, and two or more heater support members having an insulating property are provided so as to support the heater through the auxiliary electrode portions.

2) The heater is formed with alternate grooves extending downward from the upper end and upward from the lower end, as mentioned above. Assuming that the portion from one groove extending downward from the upper end to the next groove extending downward from the upper end constitutes one heat generating portion (the hatched portion indicated at 34 in FIG. 5), the number of such heat generating portions which may be present between a heater support member and an electrode and between heater support members if adjacent to each other is not larger than 4.

3) The heat generating portions of the heater each have a thickness of not less than 25 mm.

More specifically, the following three apparatuses are provided according to the present invention.

1) An apparatus for manufacturing a single crystal of silicon comprising a rotatable crucible for receiving silicon melt, a heater disposed surrounding the outer periphery of that crucible, electrodes for supplying a direct current to the heater, and a magnet for applying a horizontal magnetic field to the silicon melt contained in the crucible. This apparatus is characterized in that the heater has a plurality of heat generating portions, two main electrode portions, and two or more auxiliary electrode portions, that two or more heater support members having an insulating property are provided so as to support the heater through the auxiliary electrode portions, and that the number of heat generating portions which may be present between a heater support member and an electrode or between heater support members if adjacent to each other is not larger than 4.

2) An apparatus for manufacturing a single crystal of silicon comprising a rotatable crucible for receiving silicon melt, a heater disposed surrounding the outer periphery of the crucible, electrodes for supplying a direct current to the heater, and a magnet for applying a horizontal magnetic field to the silicon melt contained in the crucible, the apparatus being characterized in that the heater has a plurality of heat generating portions, two main electrode portions, and two or more auxiliary electrode portions, that two or more heater support members having an insulating property are provided so as to support the heater through the auxiliary electrode portions, and that the heat generating portions of the heater each have a thickness of 25 mm or more.

3) An apparatus for manufacturing a single crystal of silicon comprising a rotatable crucible for receiving silicon melt, a heater disposed surrounding the outer periphery of the crucible, electrodes for supplying a direct current to the heater, and a magnet for applying a horizontal magnetic field to the silicon melt contained in the crucible, this apparatus being characterized in that the heater has a plurality of heat generating portions, two main electrode portions, and two or more auxiliary electrode portions, that two or more heater support members having an insulating property are provided so as to support the heater through the auxiliary electrode portions, that the number of heat generating portions which may be present between a heater support member and an electrode and between heater support members if adjacent to each other is not larger than 4, and that the heat generating portions of the heater each have a thickness of 25 mm or more.

The silicon single crystal manufacturing apparatus according to the present invention is not only suitable for the manufacture of a silicon single crystal of 8 inches or larger in diameter, but also employable for the manufacture of silicon single crystals smaller than 8 inches in diameter.

DETAILED DESCRIPTION OF PREFERRED EMBODIMENTS

Embodiments of the present invention will next be described with reference to the accompanying drawings.

Figure 1:
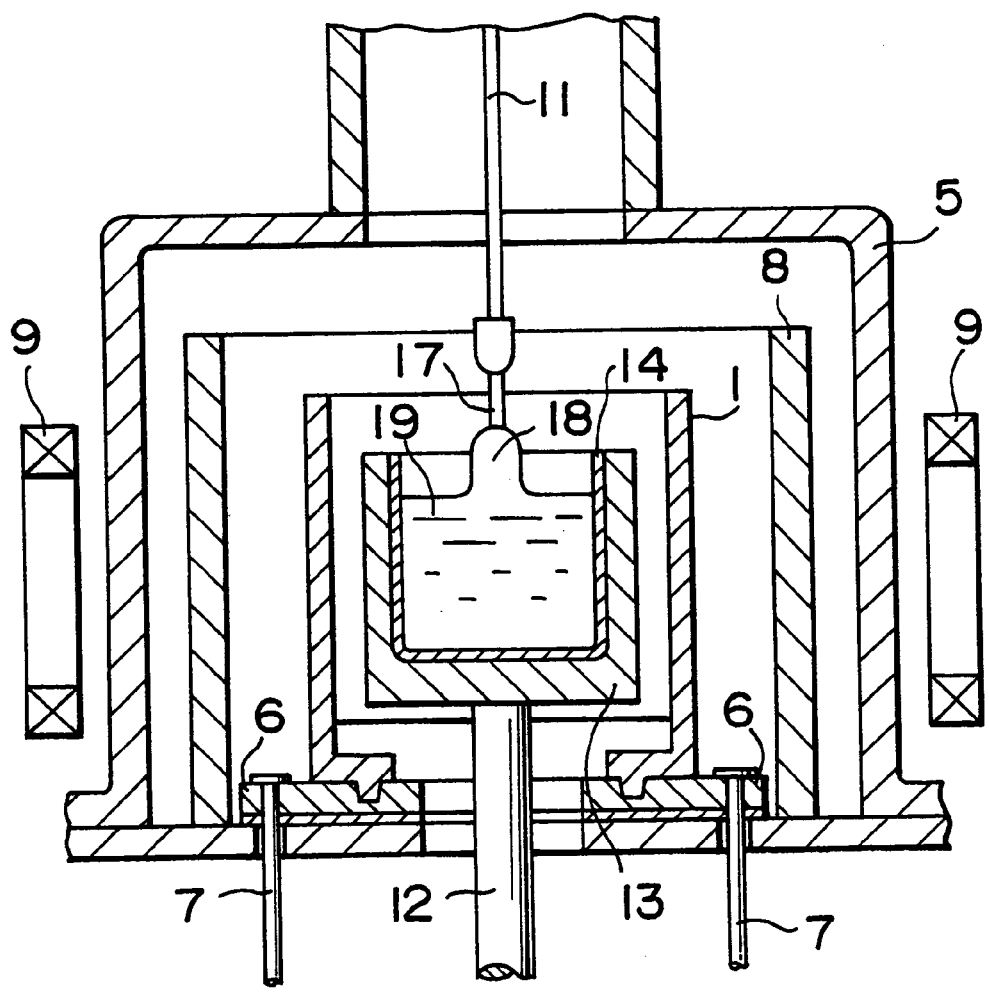
FIG. 1 is a schematic sectional view of an example of a silicon single crystal manufacturing apparatus according to the present invention.

A schematic structure of an apparatus for manufacturing a single crystal of silicon according to the present invention is shown in FIG. 1. As shown in FIG. 1, in the apparatus, a rotating shaft 12 is inserted from the bottom portion of a chamber 5. On the upper end of the rotating shaft 12 is fixed a susceptor 13, by which a crucible 14 is supported. In the crucible 14, a silicon melt 19 is accommodated. The susceptor 13 is surrounded by a heater 1. Connectors 6 are attached to the heater 1 via main electrode portions 2. The heater 1 is connected to electrodes 7, which are inserted from the bottom portion of the chamber 5, via the connector 6. The heater 1 is surrounded by a heat insulating cylinder 8. Outside of the chamber 5 are provided superconductive magnets 9 which apply a horizontal magnetic field to the silicon melt 19 in the crucible 14. A rotatable pulling member 11 for pulling a single crystal 18, such as a rotatable pulling shaft or wire, is inserted from the ceiling portion of the chamber 5. A seed crystal 17 is attached to the end part of the pulling member 11.

In the apparatus, a silicon single crystal 18 is produced by dipping the seed crystal 17 into the silicon melt 19 and pulling it from the melt with applying a horizontal magnetic field to the melt and rotating the rotating shaft 12 and the pulling member 11.

Figure 2A:
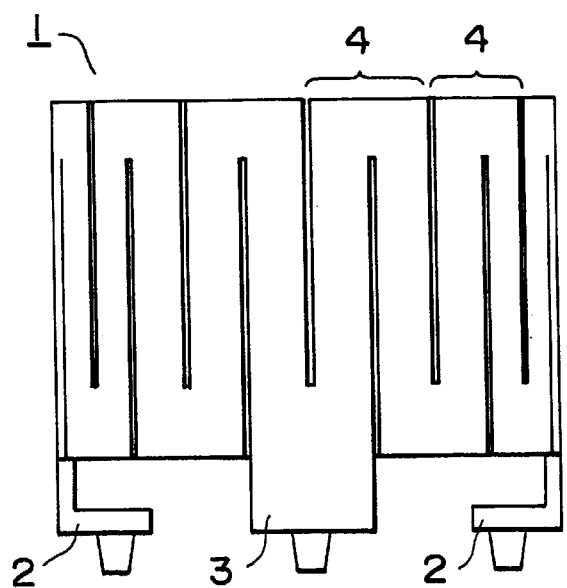
FIGS. 2A and 2B are a side view and a plan view, respectively, showing an example of a heater employable in a silicon single crystal manufacturing apparatus according to the present invention.
Figure 2B:
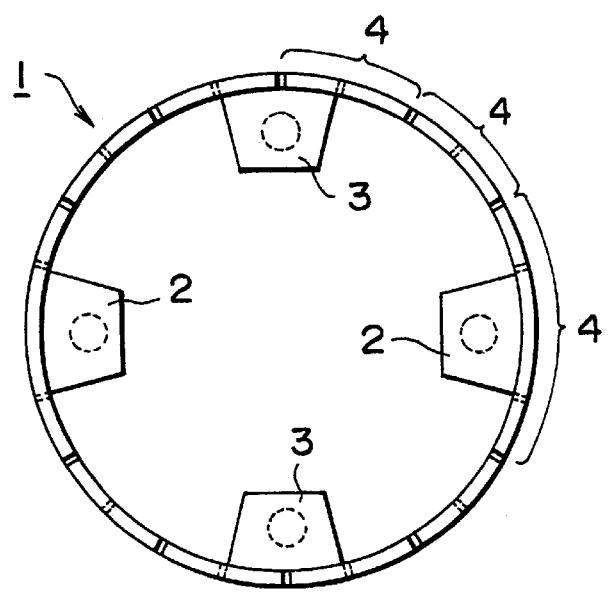
Figure 3A:
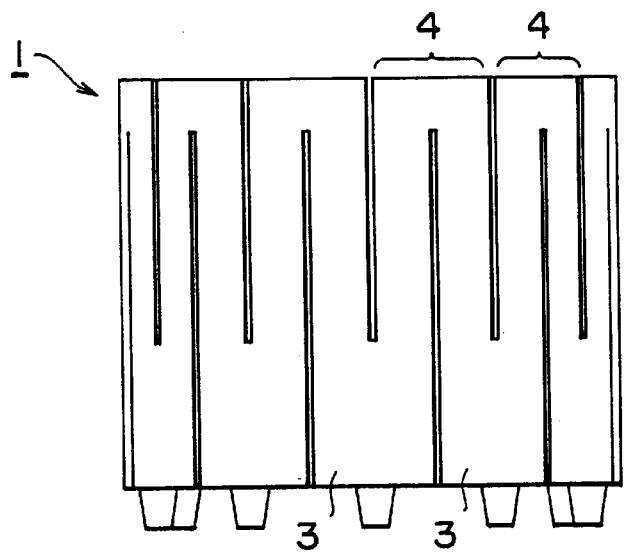
FIGS. 3A and 3B are a side view and a plan view, respectively, showing another example of a heater employable in the silicon single crystal manufacturing apparatus.
Figure 3B:
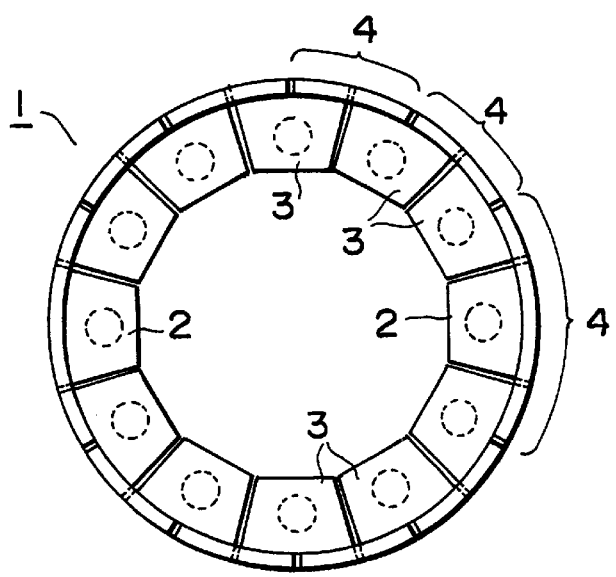

As shown in FIGS. 2A and 2B and FIGS. 3A and 3B, the heater 1 used in the apparatus for manufacturing a single crystal of silicon according to the present invention has a plurality of heat generating portions 4, two main electrode portions 2, and two or more auxiliary electrode portions 3. More specifically, the heater 1 shown in FIGS. 2A and 2B is provided with two auxiliary electrode portions 3, while the heater 1 shown in FIGS. 3A and 3B is provided with ten auxiliary electrode portions 3.

Although the auxiliary electrode portions shown in FIGS. 2A and 2B and FIGS. 3A and 3B are integral with the heat generating portions 4 of the heater 1, such an integral structure is not always required. Auxiliary electrode portions may be formed as separate members by molding using either the same material as the heater or a material different, and the auxiliary electrode portions thus formed may be attached to the lower end portion of the heater 1.

Figure 4:
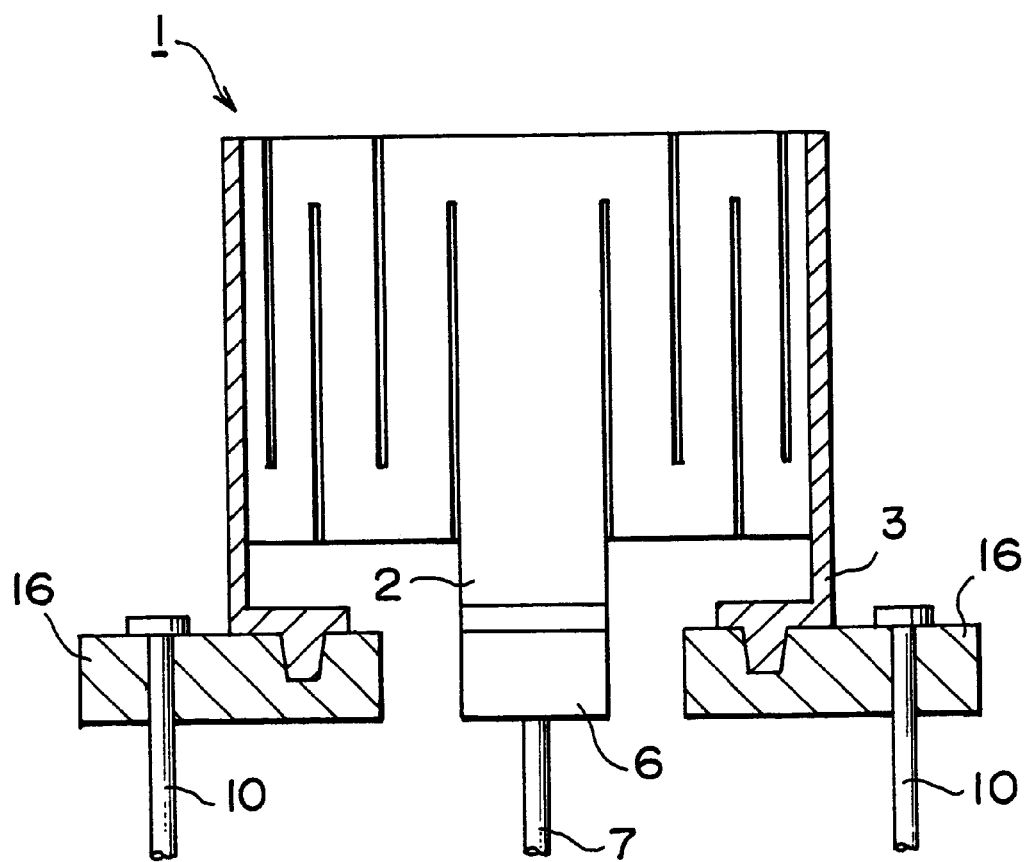
FIG. 4 is a sectional view showing that a heater according to the present invention is supported by heater support members through auxiliary electrode portions.

The silicon single crystal manufacturing apparatus according to the present invention is provided with two or more heater support members 10 with an electric insulating property for supporting the heater 1 through the auxiliary electrode portions 3, as shown in FIG. 4

The heater support members 10, which have an electric insulating property, are preferably formed of a ceramic material such as, for example, silicon carbide, silicon nitride, or alumina, because ceramic materials are superior in both heat insulation and heat resistance. Graphite is also employable as a material for the heater support members 10, and, in this case, each heater support member 10 is required to have an insulating lower portion. The heater support members 10 and the auxiliary electrode portions 3 are connected by the same method as that for connection electrodes and electrode portions through connectors 16, for example.

The shape of the heater support members 10 is not especially limited insofar as it can support the heater. An example is the same columnar shape as the electrodes. A columnar shape or a shape similar thereto is desirable because of its high resistance to forces induced by a magnetic field and acting in a rotational direction.

In an embodiment of the silicon single crystal manufacturing apparatus according to the present invention, as mentioned above, the heater has two or more auxiliary electrode portions in addition to plural heat generating portions and two main electrode portions; two or more heater support members having an insulating property are provided so as to support the heater through the auxiliary electrode portions; and in addition, the number of heat generating portions which may be present between a heater support member and an electrode or between adjacent heater support members is not larger than 4. For example, for heater 1 shown in FIGS. 2A and 2B, there are provided two heater support members. In this case, the number of the heat generating portions present between a heater support member and an electrode is one. In the case where the number of heater support members used is the same as the number of auxiliary electrodes used, the expression "present between a heater support member and an electrode" can be substituted by the expression "present between an auxiliary electrode portion and a main electrode portion."

On the other hand, in the case of heater 1 shown in FIGS. 3A and 3B, there can be provided a maximum of ten heater support members. For example, if ten heater support members are used, the number of the heat generating portions 4 present between a heater support member and an electrode adjacent thereto or between adjacent heater support members is zero.

Figure 5A:
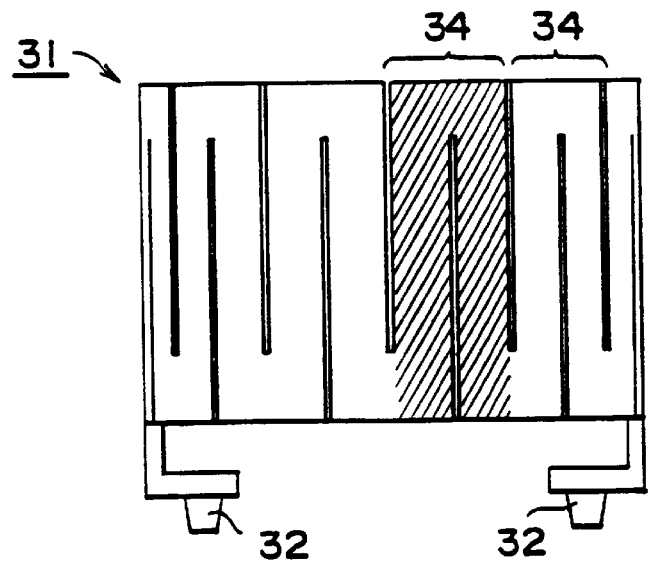
FIGS. 5A and 5B are a side view and a plan view, respectively, showing an example of a heater used in a conventional silicon single crystal manufacturing apparatus.
Figure 5B:
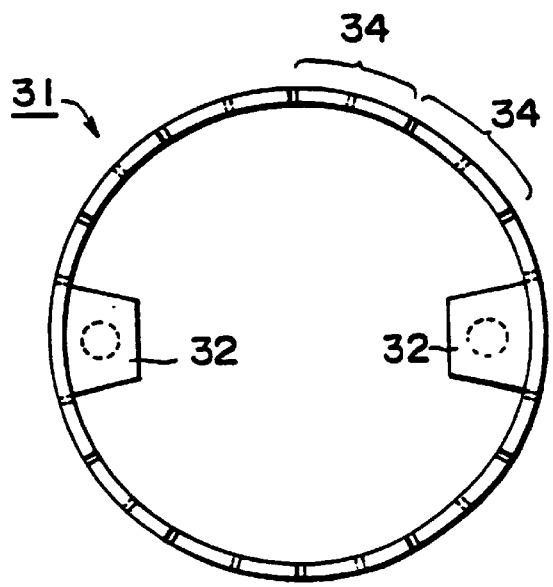

The heaters shown in FIGS. 2A and 2B and FIGS. 3A and 3B each have the same total number (8) of heat generating portions as that of heat generating portions 34 of the conventional heater 31 shown in FIGS. 5A and 5B. In the silicon single crystal manufacturing apparatus according to the present invention, it is required that the number of a heat generating portions which may be present between a heater support member and an electrode and between heater support members if adjacent to each other be not larger than 4 and that a total of four or more heat generating portions be present in the heater.

In another embodiment of the silicon single crystal manufacturing apparatus according to the present invention, as mentioned above, the heater has a plurality of heat generating portions, two main electrode portions and two or more auxiliary electrode portions; there are provided two or more heater support members of an insulating property for supporting the heater through the auxiliary electrode portions; and in addition, the thickness of each heat generating portion in the heater is set at 25 mm or more.

Preferably, the thickness of each heat generating portion is not larger than 50 mm. This is because if the thickness is larger than 50 mm, the electric current flowing through the heater becomes too large, and also because the heater itself becomes too heavy.

In a further embodiment of the silicon single crystal manufacturing apparatus according to the present invention, as mentioned above, the heater has a plurality of heat generating portions, two main electrode portions and two or more auxiliary electrode portions, and there are provided two or more heater support members of an insulating property for supporting the heater through the auxiliary electrode portions, and, in addition, the number of heat generating portions which may be present between a heater support member and an electrode and between adjacent heater support members is not larger than 4 and each of these heat generating portions has a thickness of 25 mm or more. According to this construction, distortion of the heater is further suppressed and a single crystal of silicon can be produced without causing breakage of the heater, even if a larger electric current flows through the heater, even if a magnetic field of a higher intensity is applied to the silicon melt in the crucible, and even if the heater is of a larger diameter.

EXAMPLES

Silicon single crystals each having a diameter of 8 inches were produced in a horizontal magnetic field of 0.4 T using a quartz crucible having a diameter of 24 inches in a silicon single crystal manufacturing apparatus according to the present invention and in a conventional silicon single crystal manufacturing apparatus.

In the silicon single crystal manufacturing apparatus according to the present invention, graphite heaters were used having an inner diameter of 28 inches and having such shapes as shown in FIGS. 2A and 2B and FIGS. 3A and 3B. In using the heater of the shape shown in FIGS. 2A and 2B, there were used two heater support members, while in using the heater of the shape shown in FIGS. 3A and 3B, there were used ten heater support members. Accordingly, the number of heat generating portions present between a heater support member and an electrode and/or between adjacent heater support members, was one for the heater having the shape shown in FIGS. 2A and 2B and zero in the heater having the shape shown in FIGS. 3A and 3B.

In both heaters, the thickness of each heat generating portion was set at 25 mm.

In the conventional silicon single crystal manufacturing apparatus there was used a graphite heater having an inner diameter of 28 inches and having the shape shown in FIGS. 5A and 5B. No heater support members were used. The thickness of each heat generating portion of the heater was set at 20 mm.

By the silicon single crystal manufacturing apparatus according to the present invention, it was possible to pull silicon single crystals of 8-inch diameter at a desired length with no resulting breaking of the heaters.

In the conventional silicon single crystal manufacturing apparatus, the heater was broken during pulling of a silicon single crystal having a diameter of 8 inches and the crystal pulling operation was forced to halt.

The present invention is not limited to the abovedescribed embodiments. The above-described embodiments are mere examples, and those having the substantially same structure as that described in the appended claims and providing the similar action and effects are included in the scope of the present invention.

According to the present invention, as set forth hereinabove, it is possible to produce a single crystal of silicon without causing breakage of a heater, even if a large electric current flows through the heater, even if a magnetic field of a high intensity is applied to a silicon melt in the crucible, and even if the heater is of a large diameter. The present invention is particularly suitable for the manufacture of silicon single crystal of diameters as large as 8 inches or more.

What is claimed is:

1. An apparatus for manufacturing a single crystal of silicon, comprising:

a rotatable crucible for receiving a silicon melt;

a heater surrounding the outer periphery of the crucible, the heater having a plurality of heat generating portions, two main electrodes for receiving a direct current, and two or more auxiliary electrode portions;

two or more heater support members having an insulating property and supporting the heater through the auxiliary electrode portions; and a magnet for applying a horizontal magnetic field to the silicon melt contained in the crucible, wherein the number of heat generating portions which are present between a heater support member and an electrode, and between heater support members that are adjacent to each other, is equal to or less than 4.

2. An apparatus for manufacturing a single crystal of silicon according to claim 1, wherein each heat generating portion of the heater has a thickness of 25 mm or more.

3. An apparatus for manufacturing a single crystal of silicon, comprising:

a rotatable crucible for receiving a silicon melt;

a heater surrounding the outer periphery of the crucible, the heater having a plurality of heat generating portions, two main electrodes for receiving a direct current, and two or more auxiliary electrode portions;

two or more heater support members having an insulating property and supporting the heater through the auxiliary electrode portions; and a magnet for applying a horizontal magnetic field to the silicon melt contained in the crucible, wherein each heat generating portion of the heater has a thickness of 25 mm or more.

4. An apparatus for manufacturing a single crystal of silicon according to claim 3, wherein the number of heat generating portions which are present between a heater support member and an electrode, or between heater support members that are adjacent to each other, is equal to or less than 4.

5. An apparatus for manufacturing a single crystal of silicon, comprising:

a rotatable crucible for receiving a silicon melt;

a heater surrounding the outer periphery of the crucible, the heater having a plurality of heat generating portions, two main electrodes for receiving a direct current, and two or more auxiliary electrode portions;

two or more heater support members having an insulating property and supporting the heater through the auxiliary electrode portions; and a magnet for applying a horizontal magnetic field to the silicon melt contained in the crucible, wherein the number of heat generating portions which are present between a heater support member and an electrode, and between heater support members that are adjacent to each other, is equal to or less than 4, and each heat generating portion of the heater has a thickness of 25 mm or more.

* * * * *